(12) United States Patent
Ogata et al.

(10) Patent No.: US 8,253,077 B2
(45) Date of Patent: Aug. 28, 2012

(54) SUBSTRATE PROCESSING METHOD, COMPUTER-READABLE STORAGE MEDIUM AND SUBSTRATE PROCESSING SYSTEM

(75) Inventors: Kunie Ogata, Koshi (JP); Masahide Tadokoro, Koshi (JP); Tsuyoshi Shibata, Koshi (JP); Shinichi Shinozuka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/159,055

(22) Filed: Jun. 13, 2011

(65) Prior Publication Data

US 2011/0242513 A1   Oct. 6, 2011

Related U.S. Application Data

(62) Division of application No. 12/426,600, filed on Apr. 20, 2009, now Pat. No. 7,985,516.

(30) Foreign Application Priority Data

Apr. 25, 2008   (JP) .................. 2008-115817

(51) Int. Cl.
    *H05B 3/68* (2006.01)
(52) U.S. Cl. .................. 219/444.1; 219/482; 219/490; 382/145; 382/146; 392/418; 430/30; 430/330; 700/207; 700/300
(58) Field of Classification Search .................. 430/30, 430/330; 382/145, 146; 219/444.1, 482; 219/490; 392/418; 700/207, 300
    See application file for complete search history.

(56) References Cited

U.S. PATENT DOCUMENTS

| 7,588,868 B2 | 9/2009 | Zach et al. |
| 7,897,897 B2 | 3/2011 | Jyousaka et al. |
| 2009/0008381 A1 | 1/2009 | Jyousaka et al. |

FOREIGN PATENT DOCUMENTS

| JP | 2006-222354 | 8/2006 |
| JP | 2006-228816 | 8/2006 |
| JP | 2007-115790 | 5/2007 |
| JP | 2007-311690 | 11/2007 |

OTHER PUBLICATIONS

Office Action (with English translation) issued on Apr. 24, 2012, in counterpart Japanese Appln. No. 2008-115817 (5 pages).

*Primary Examiner* — Christopher Young
(74) *Attorney, Agent, or Firm* — Oblon, Spivak, McClelland, Maier & Neustadt, L.L.P.

(57) ABSTRACT

A processing temperature of thermal processing is corrected based on measurement of a first dimension of a resist pattern on a substrate from a previously obtained relation between a dimension of a resist pattern and a temperature of thermal processing, a second dimension of the resist pattern after thermal processing is performed at the corrected processing temperature is measured, a distribution within the substrate of the second dimension is classified into a linear component expressed by an approximated curved surface and a nonlinear component, a processing condition of exposure processing is corrected based on the linear component from a previously obtained relation between a dimension of a resist pattern and a processing condition of exposure processing, and thermal processing at the processing temperature corrected in a temperature correcting step and exposure processing under the processing condition corrected in an exposure condition correcting step are performed to form a predetermined pattern.

5 Claims, 12 Drawing Sheets

LINE WIDTH MEASURED VALUE = LINEAR COMPONENT + NONLINEAR COMPONENT

FIG.16

| | (a) BEFORE CORRECTION OF PEB HEATING TEMPERATURE | (b) AFTER CORRECTION OF PEB HEATING TEMPERATURE | (c) AFTER CORRECTION OF EXPOSURE AMOUNT |
|---|---|---|---|
| LINE WIDTH AVERAGE (nm) | 113.63 | 110.26 | 110.30 |
| $3\sigma$ (nm) | 4.46 | 1.90 | 0.85 |

# SUBSTRATE PROCESSING METHOD, COMPUTER-READABLE STORAGE MEDIUM AND SUBSTRATE PROCESSING SYSTEM

CROSS REFERENCE TO RELATED APPLICATION

The present application is a divisional application of and claims priority to U.S. application Ser. No. 12/426,600, filed Apr. 20, 2009, of which the entire contents are hereby incorporated by reference. The present application also claims priority via the '600 application to Japanese Application 2008-115817, filed Apr. 25, 2008.

BACKGROUND OF THE INVENTION

1. Field of the Invention

The present invention relates to a substrate processing method of performing photolithography processing on a substrate such as, for example, a semiconductor wafer or the like to form a predetermined resist pattern on the substrate, a computer-readable storage medium and a substrate processing system.

2. Description of the Related Art

In photolithography processing in manufacture, for example, of a semiconductor device, for example, a resist coating treatment of applying a resist solution onto, for example, a semiconductor wafer (hereinafter, referred to as a "wafer") to form a resist film, exposure processing of exposing the resist film to a predetermined pattern, post-exposure baking processing (hereinafter, referred to as "PEB processing") of perform heating in order to accelerate the chemical reaction of the resist film after the exposure, a developing treatment of developing the exposed resist film and so on are performed in sequence to form a predetermined resist pattern on the wafer.

The above-described resist pattern is used to determine a pattern form of a processing film thereunder and thus needs to be formed in an exact dimension. For this end, it has been proposed that photolithography processing is performed to form a resist pattern on the wafer, the dimension of the resist pattern is measured and, based on the dimension measurement result, for example, the heating temperature of the PEB processing or the like is corrected to make the dimension of the resist pattern appropriate. In this case, the correction of the heating temperature is performed, for example, by correcting the temperature of a thermal plate for mounting and heating the wafer thereon. For example, a heater generating heat by power feeding is embedded in the thermal plate, so that the thermal plate is adjusted to a predetermined temperature by adjusting the temperature of the heater (Japanese Patent Application Laid-open No. 2006-228816).

SUMMARY OF THE INVENTION

However, since heaters are fixed to a thermal plate in a predetermined pattern, there might be a region where the thermal plate could not be corrected to a predetermined temperature. Consequently, appropriate heating of the wafer could not be performed in this region to fail to form the resist pattern in a predetermined dimension, so that the resist pattern could not be uniformly formed within the wafer.

The present invention has been made in consideration of the above points, and its object is to uniformly form a resist pattern in a predetermined dimension within a substrate.

To attain the above object, the present invention is a substrate processing method of performing photolithography processing on a substrate to form a resist pattern on the substrate, the method including: a temperature correcting step of forming a resist pattern on a substrate, then measuring a first dimension of the resist pattern, and correcting a processing temperature of thermal processing based on the measured first dimension from a previously obtained relation between a dimension of a resist pattern and a processing temperature of thermal processing during photolithography processing; a dimension measuring step of performing thermal processing at the processing temperature corrected in the temperature correcting step to form a resist pattern on a substrate, and then measuring a second dimension of the resist pattern; a dimension classifying step of classifying a distribution within the substrate of the measured second dimension into a linear component expressed by an approximated curved surface and a nonlinear component other than the linear component; and an exposure condition correcting step of dividing the linear component into a plurality of regions, and correcting a processing condition of exposure processing for each of the regions based on the linear component in each of the regions from a previously obtained relation between a dimension of a resist pattern and a processing condition of exposure processing during photolithography processing. Then, thermal processing at the processing temperature corrected in the temperature correcting step and exposure processing under the processing condition corrected in the exposure condition correcting step are performed to form a predetermined resist pattern on a substrate.

Note that the dimension of the resist pattern is, for example, the line width of the resist pattern, the side wall angle of the resist pattern, the diameter of a contact hole or the like. Further, the processing condition of the exposure processing is, for example, the exposure amount (the dose amount of light from the exposure light source), the focus value in the exposure processing or the like.

According to the present invention, since the processing temperature of the thermal processing is first corrected, thermal processing at the corrected processing temperatures is then performed to form a resist pattern on the substrate, whereby the average value within the substrate of the second dimension of the resist pattern can be roughly brought to a predetermined dimension. However, there may be a nonuniform region in the distribution within the substrate of the second dimension of the resist pattern where the resist pattern is not formed in a predetermined dimension due to, for example, the influence of the above-described heater pattern. Hence, in the present invention, the processing condition of the exposure processing is further corrected for each of a plurality of regions on the substrate, and exposure processing is then performed under the corrected processing conditions. This makes it possible to form the resist pattern in the predetermined dimension even in the above-described nonuniform region. Accordingly, the thermal processing is performed at the corrected processing temperatures and the exposure processing is performed under the corrected processing conditions, whereby a resist pattern in the predetermined dimension can be uniformly formed within the substrate.

Further, in the present invention, the distribution within the substrate of the second dimension of the resist pattern is classified into a linear component and a nonlinear component when correcting the processing condition of the exposure processing. Here, the nonlinear component contains a factor to irregularly vary the dimension of the resist pattern for each substrate such as, for example, particles adhering onto the substrate and the warpage of the substrate. Accordingly, the nonlinear component can be said to be an unstable component with low reproducibility, and therefore is not suitable as a correction object. According to the present invention, the processing condition of the exposure processing is corrected based on the linear component obtained by subtracting the nonlinear component, so that the correction for the processing condition of the exposure processing can be appropriately performed.

The present invention according to another aspect is a computer-readable storage medium storing a program running on a computer of a control unit for controlling a substrate processing system to cause the substrate processing system to execute the above-described substrate processing method.

The present invention according to still another aspect is a substrate processing system for performing photolithography processing on a substrate to form a resist pattern on the substrate, the system including: a thermal processing unit for performing thermal processing on a substrate; an aligner for performing exposure processing on the substrate; a pattern dimension measuring unit for measuring a dimension of the resist pattern on the substrate; and a control unit for correcting a processing temperature of the thermal processing in the thermal processing unit and a processing condition of the exposure processing in the aligner.

Further, the control unit controls the thermal processing unit, the aligner, and the pattern dimension measuring unit to execute a temperature correcting step of forming a resist pattern on a substrate, then measuring a first dimension of the resist pattern, and correcting the processing temperature of the thermal processing based on the measured first dimension from a previously obtained relation between a dimension of a resist pattern and a processing temperature of thermal processing during photolithography processing; a dimension measuring step of performing thermal processing at the processing temperature corrected in the temperature correcting step to form a resist pattern on a substrate, and then measuring a second dimension of the resist pattern; a dimension classifying step of classifying a distribution within the substrate of the measured second dimension into a linear component expressed by an approximated curved surface and a nonlinear component other than the linear component; and an exposure condition correcting step of dividing the linear component into a plurality of regions, and correcting the processing condition of the exposure processing for each of the regions based on the linear component in each of the regions from a previously obtained relation between a dimension of a resist pattern and a processing condition of exposure processing during photolithography processing, wherein thermal processing at the processing temperature corrected in the temperature correcting step and exposure processing under the processing condition corrected in the exposure condition correcting step are performed to form a predetermined resist pattern on a substrate.

BRIEF DESCRIPTION OF THE DRAWINGS

FIG. 16 shows distributions within the wafer of the line width of the resist pattern when simulation is performed by the method according to this embodiment, (a) showing a distribution within the wafer of the line width before the heating temperature of the PEB processing is corrected; (b) showing a distribution within the wafer of the line width after the heating temperature of the PEB processing is corrected; and (c) showing a distribution within the wafer of the line width after the exposure amount is corrected.

DETAILED DESCRIPTION OF THE INVENTION

Figure 1:
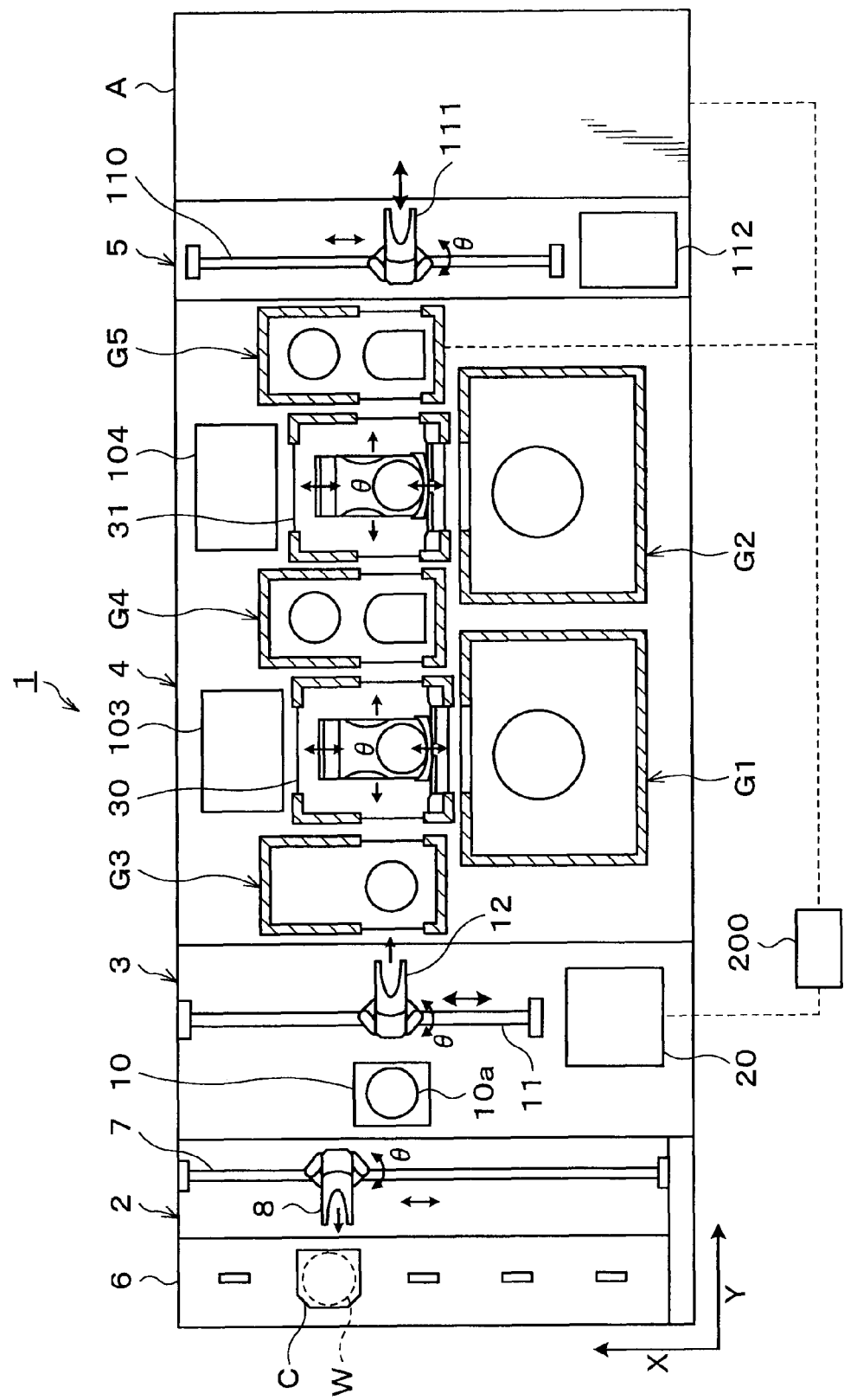
FIG. 1 is a plan view showing the outline of a configuration of a coating and developing treatment system according to this embodiment.
Figure 2:
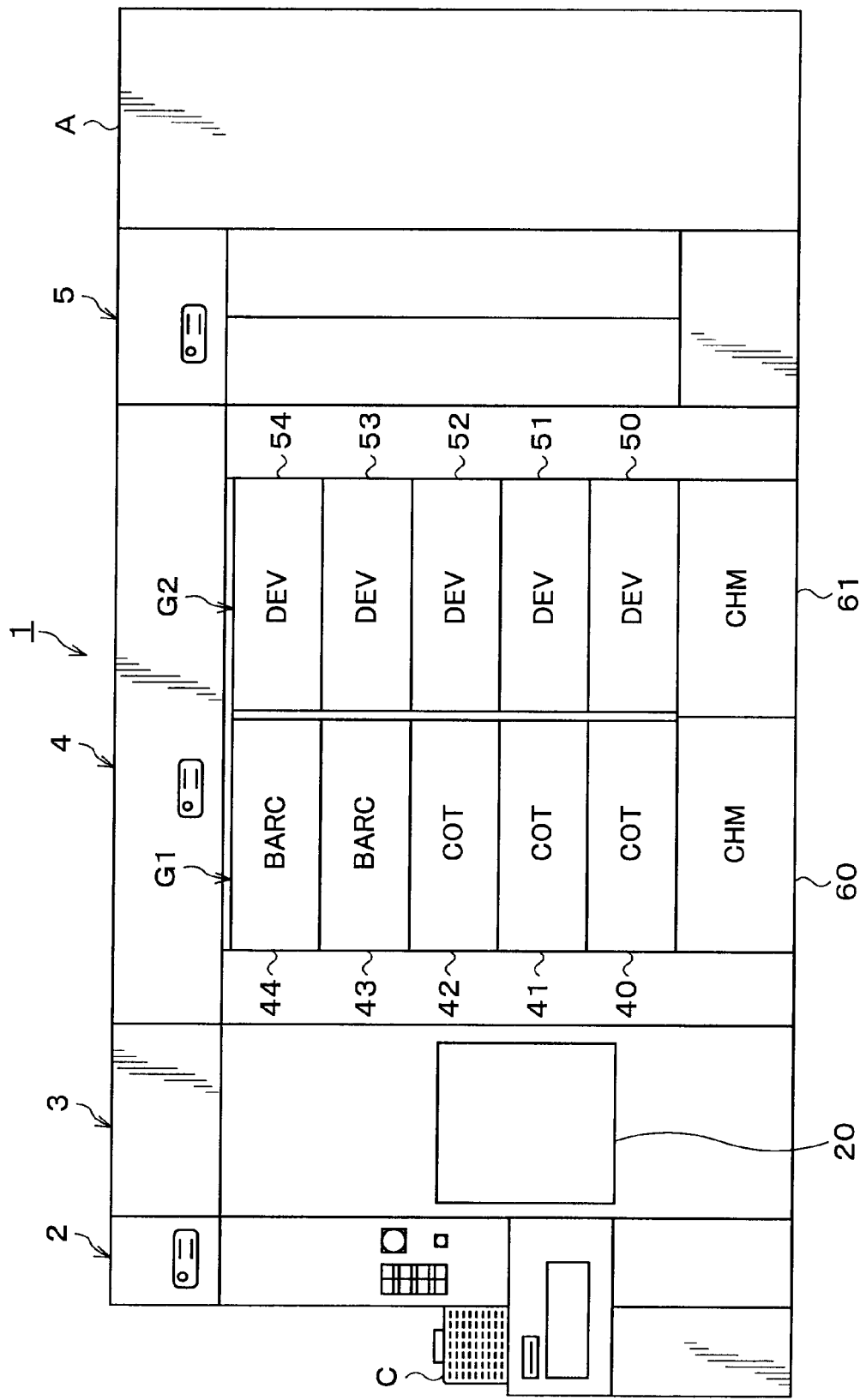
FIG. 2 is a front view of the coating and developing treatment system according to this embodiment.
Figure 3:
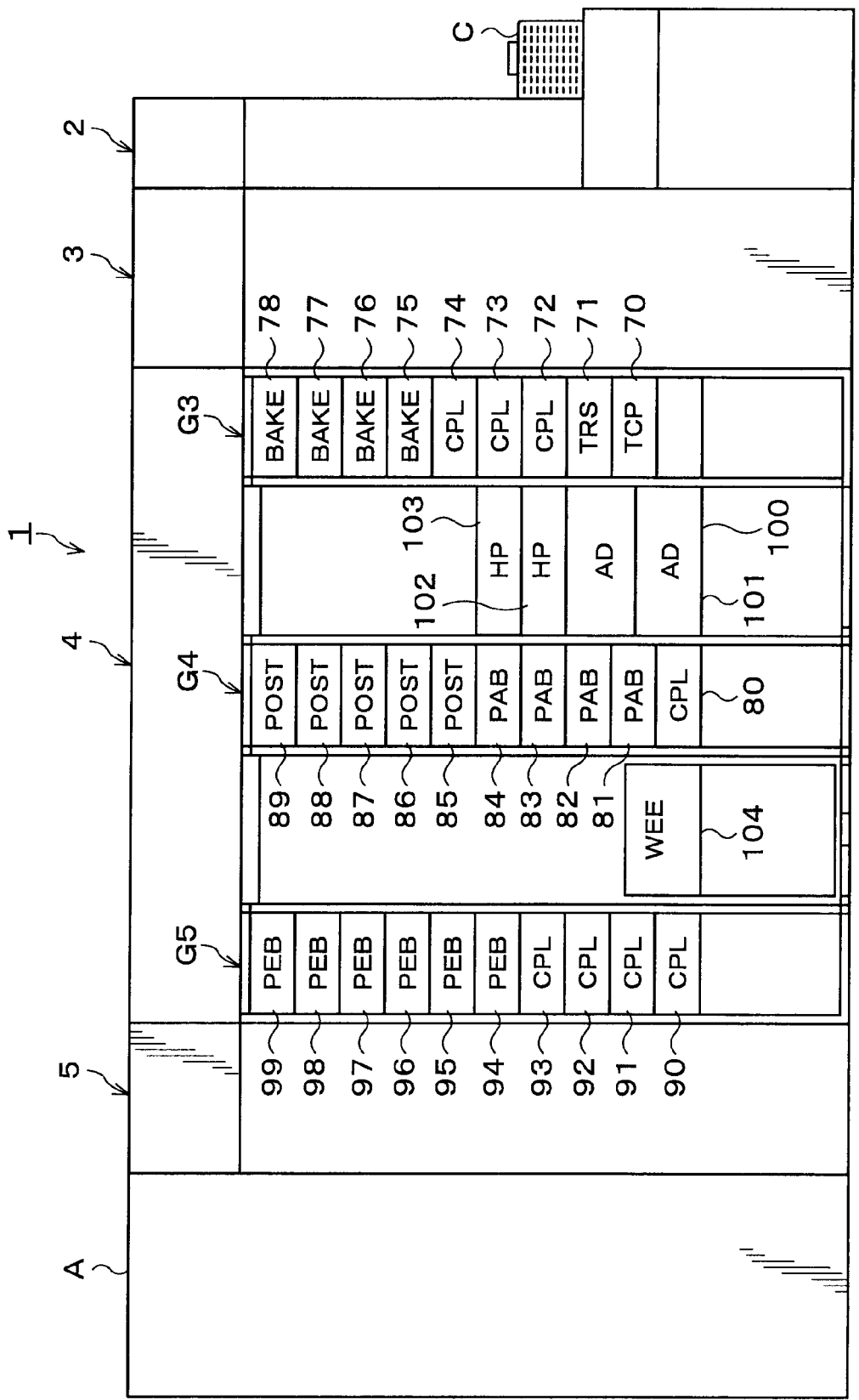
FIG. 3 is a rear view of the coating and developing treatment system according to this embodiment.

Hereinafter, preferred embodiments of the present invention will be described. FIG. 1 is a plan view showing the outline of a configuration of a coating and developing treatment system 1 as a substrate processing system according to this embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; an inspection station 3 for performing predetermined inspection on the wafers W, a processing station 4 including a plurality of various kinds of processing and treatment units, which are multi-tiered, for performing predetermined processing and treatment on the wafers W in a manner of single wafer processing in the photolithography processing, and an interface station 5 for passing the wafers W to/from an aligner A provided adjacent to the processing station 4, are integrally connected.

In the cassette station 2, a cassette mounting table 6 is provided and configured such that a plurality of cassettes C can be mounted on the cassette mounting table 6 in a line in an X-direction (a top-to-bottom direction in FIG. 1). In the cassette station 2, a wafer transfer body 8 is provided which is movable along the X-direction on a transfer path 7. The wafer transfer body 8 is also movable in a wafer-arrangement direction of the wafers W housed in the cassette C (a Z-direction; the vertical direction), and thus can selectively access the wafers W arranged in the vertical direction in the cassette C. The wafer transfer body 8 is rotatable around an axis (a θ-direction) in the vertical direction and thus can also get access to a later-described transition unit 10 on the inspection station 3 side.

In the inspection station 3 adjacent to the cassette station 2, a pattern dimension measuring unit 20 is provided which measures the dimension of a resist pattern on the wafer W. The pattern dimension measuring unit 20 is disposed, for example, on a negative direction side in the X-direction (the lower direction in FIG. 1) in the inspection station 3. For example, on the cassette station 2 side in the inspection station 3, the transition unit 10 is disposed for passing the wafer W to/from the cassette station 2. In the transition unit 10, for example, a mounting part 10a is provided for mounting the wafer W thereon. On a positive direction side in the X-direction (the upper direction in FIG. 1) of the pattern dimension measuring unit 20, a wafer transfer unit 12 is provided which is movable along the X-direction, for example, on a transfer path 11. The wafer transfer unit 12 is movable, for example, in the vertical direction and also rotatable in the θ-direction to be able to get access to the pattern dimension measuring unit 20, the transition unit 10, and the processing and treatment units in a later-described third processing unit group G3 on the processing station 4 side.

The processing station 4 adjacent to the inspection station 3 includes, for example, five processing unit groups G1 to G5 in each of which a plurality of processing and treatment units are multi-tiered. On the negative direction side in the X-direction (the lower direction in FIG. 1) in the processing station 4, the first processing unit group G1 and the second processing unit group G2 are placed in order from the inspection station 3 side. On the positive direction side in the X-direction (the upper direction in FIG. 1) in the processing station 4, the third processing unit group G3, the fourth processing unit group G4, and the fifth processing unit group G5 are placed in order from the inspection station 3 side. Between the third processing unit group G3 and the fourth processing unit group G4, a first transfer unit 30 is provided. The first transfer unit 30 can selectively get access to the processing and treatment units in the first processing unit group G1, the third processing unit group G3, and the forth processing unit group G4 and transfer the wafer W to them. Between the fourth processing unit group G4 and the fifth processing unit group G5, a second transfer unit 31 is provided. The second transfer unit 31 can selectively get access to the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined treatment solution onto the wafer W to perform treatment, for example, resist coating units 40, 41, and 42 each for applying a resist solution onto the wafer W to form a resist film, and bottom coating units 43 and 44 each for forming an anti-reflection film which prevents reflection of light during exposure processing, are five-tiered in order from the bottom. In the second processing unit group G2, solution treatment units, for example, developing treatment units 50 to 54 each for supplying a developing solution to the wafer W to perform developing treatment are five-tiered in order from the bottom. Further, chemical chambers 60 and 61 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, a temperature regulating unit 70, a transition unit 71 for passing the wafer W, high-precision temperature regulating units 72 to 74 each for regulating the wafer temperature under temperature control with a high precision, and high-temperature thermal processing units 75 to 78 each for heating the wafer W at a high temperature, are nine-tiered in order from the bottom.

In the fourth processing unit group G4, for example, a high-precision temperature regulating unit 80, pre-baking units (hereinafter, referred to as "PAB units") 81 to 84 each for heat-processing the wafer W after the resist coating treatment, and post-baking units (hereinafter, referred to as "POST units") 85 to 89 each for heat-processing the wafer W after the developing treatment, are ten-tiered in order from the bottom.

In the fifth processing unit group G5, a plurality of thermal processing units each for thermally processing the wafer W, for example, high-precision temperature regulating unit 90 to 93, and post-exposure baking units (hereinafter, referred to as "PEB units") 94 to 99 as thermal processing units each for performing heat processing as thermal processing on the wafer W, are ten-tiered in order form the bottom.

As shown in FIG. 1, on the positive direction side in the X-direction of the first transfer unit 30, a plurality of processing and treatment units are arranged, for example, adhesion units 100 and 101 each for performing hydrophobic treatment on the wafer W and heat-processing units 102 and 103 each for heat-processing the wafer W being four-tiered in order from the bottom as shown in FIG. 3. As shown in FIG. 1, on the positive direction side in the X-direction of the second transfer unit 31, for example, an edge exposure unit 104 is disposed which selectively exposes only the edge portion of the wafer W to light.

In the interface station 5, for example, a wafer transfer body 111 moving on a transfer path 110 extending in the X-direction and a buffer cassette 112 are provided as shown in FIG. 1. The wafer transfer body 111 is movable in the Z-direction and also rotatable in the θ-direction and thus can get access to the aligner A adjacent to the interface station 5, the buffer cassette 112, and the fifth processing unit group G5 and transfer the wafer W to them.

Figure 4:
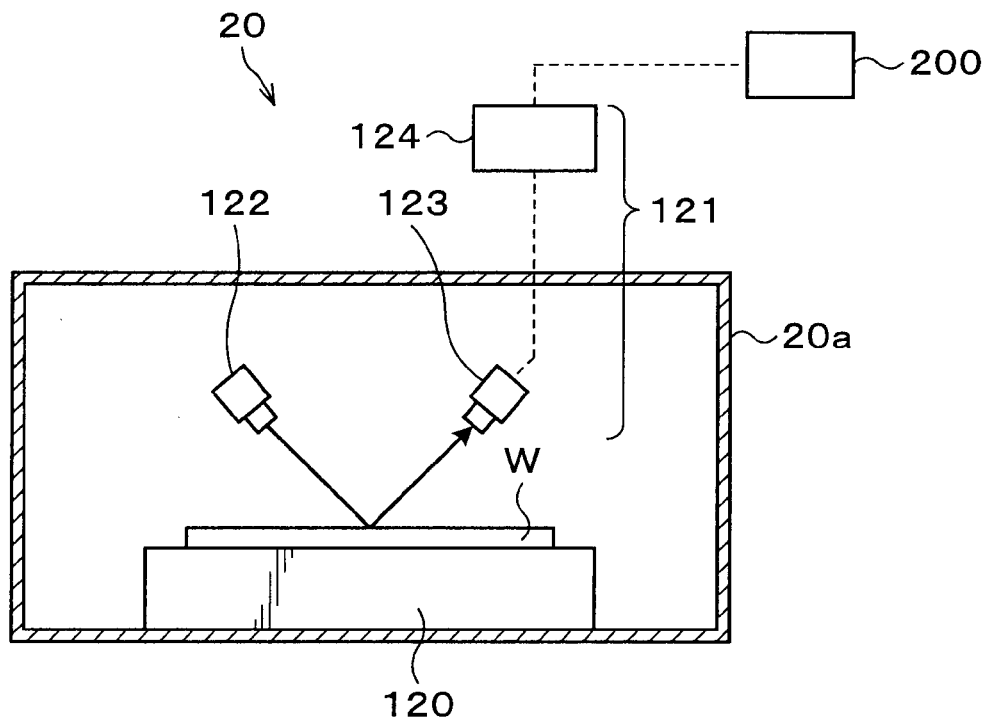
FIG. 4 is a longitudinal sectional view showing the outline of a configuration of a pattern dimension measuring unit.

Next, a configuration of the above-described pattern dimension measuring unit 20 will be described. The pattern dimension measuring unit 20 includes, for example, a casing 20a having a transfer-in/out port (not shown) for the wafer W formed in its side surface as shown in FIG. 4. In the casing 20a, a mounting table 120 for horizontally mounting the wafer W thereon and an optical profilometer 121 are provided. The mounting table 120 is movable, for example, in two dimensional directions in the horizontal directions. The optical profilometer 121 includes, for example, a light applying part 122 for applying light to the wafer W from an oblique direction, a light detecting part 123 for detecting light applied from the light applying part 122 and reflected off the wafer W, and a measuring part 124 for calculating the dimension of the resist pattern on the wafer W based on light received information from the detecting part 123. The pattern dimension measuring unit 20 is for measuring the dimension of the resist pattern using, for example, the Scatterometry method, and the measuring part 124 can measure the dimension of the resist pattern by matching the light intensity distribution within the wafer detected by the light detecting part 123 to a virtual light intensity distribution stored in advance to obtain the dimension of a resist pattern corresponding to the matched virtual light intensity distribution. Note that in this embodiment, for example, the line width of the resist pattern is measured as the dimension of the resist pattern.

Figure 5:
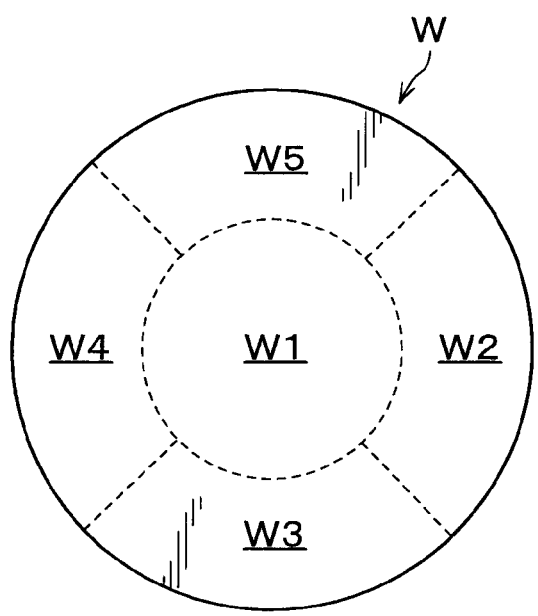
FIG. 5 is an explanatory view showing divided wafer regions.

Further, by horizontally moving the wafer W relative to the light applying part 122 and the light detecting part 123, the pattern dimension measuring unit 20 can measure the line width of the resist pattern at a plurality of measurement points for each of a plurality of regions within the wafer W, for example, wafer regions $W_1$ to $W_5$ as shown in FIG. 5. The wafer regions $W_1$ to $W_5$ correspond to thermal plate regions $R_1$ to $R_5$ in the later-described PEB units 94 to 99. Note that the number and the shape of the regions within the wafer W are not limited to those of the regions shown in FIG. 5 but can be arbitrarily selected.

Figure 6:
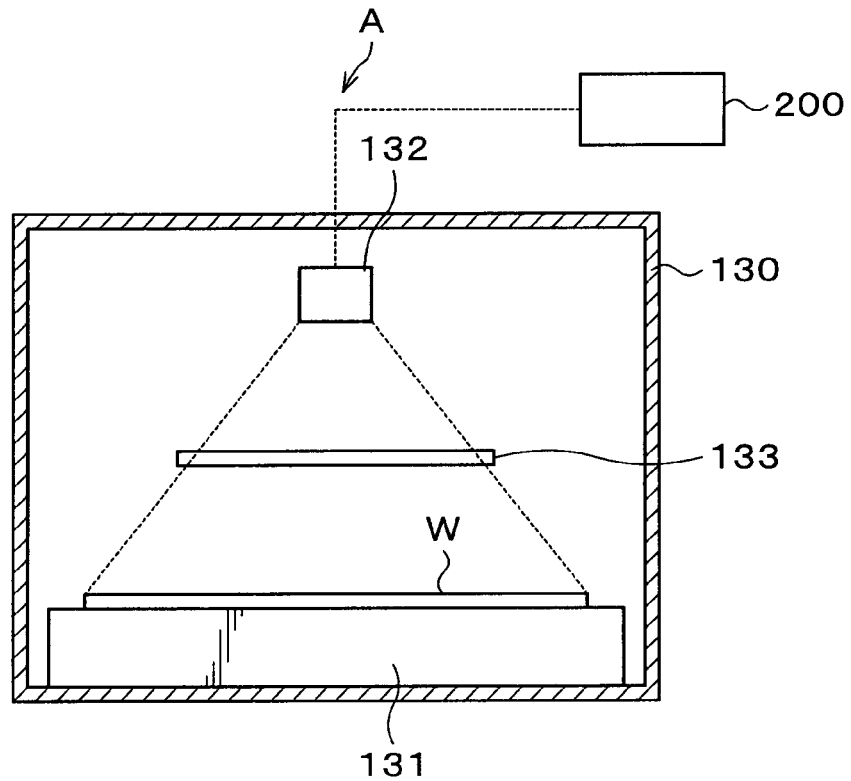
FIG. 6 is a longitudinal sectional view showing the outline of a configuration of an aligner.
Figure 7:
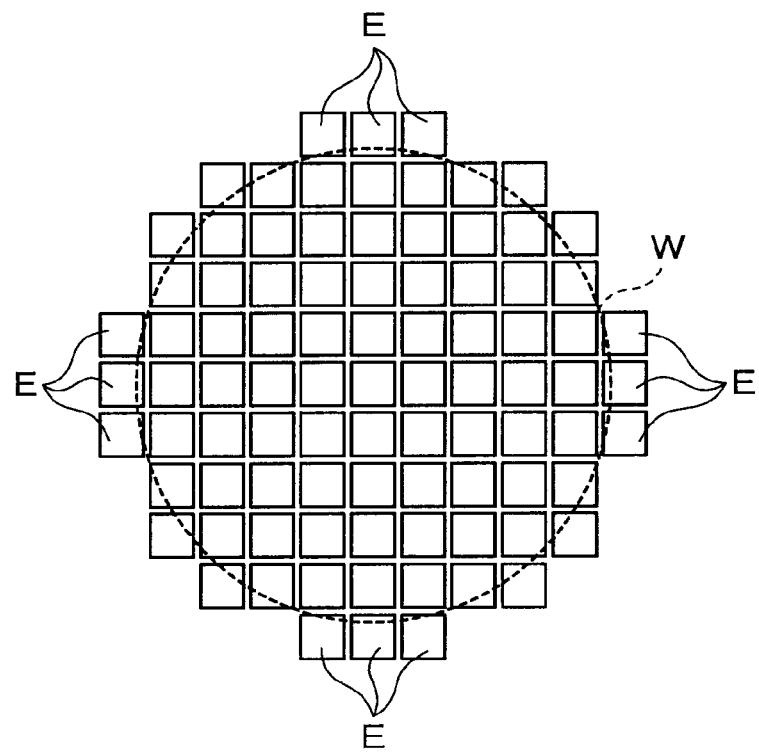
FIG. 7 is an explanatory view showing divided exposure regions.

Next, a configuration of the above-described aligner A will be described. The aligner A has a casing 130 having a transfer-in/out port (not shown) for the wafer W formed in its side surface as shown in FIG. 6. In the casing 130, a mounting table 131 for mounting the wafer W at a predetermined position, a light source 132 for applying light to the wafer W mounted on the mounting table 131, and a mask 133 having a predetermined pattern laid out therein are provided. The mask 133 is placed between the mounting table 133 and the light source 132. The aligner A can apply light from the light source 132 to the wafer W on the mounting table 131 through the mask 133 to thereby expose the resist film on the wafer W to the predetermined pattern. In this event, the light applied from the light source 132 is applied for each of exposure regions E made by dividing the wafer W into a plurality of regions in a lattice shape as shown in FIG. 7, whereby the resist film on the wafer W is exposed to light for each of the exposure regions E. As a processing condition of exposure when applying light from the light source 132, for example, the exposure amount (the dose amount of light from the light source 132) or the like is controlled for each of the exposure regions E by a later-described control unit 200.

Figure 8:
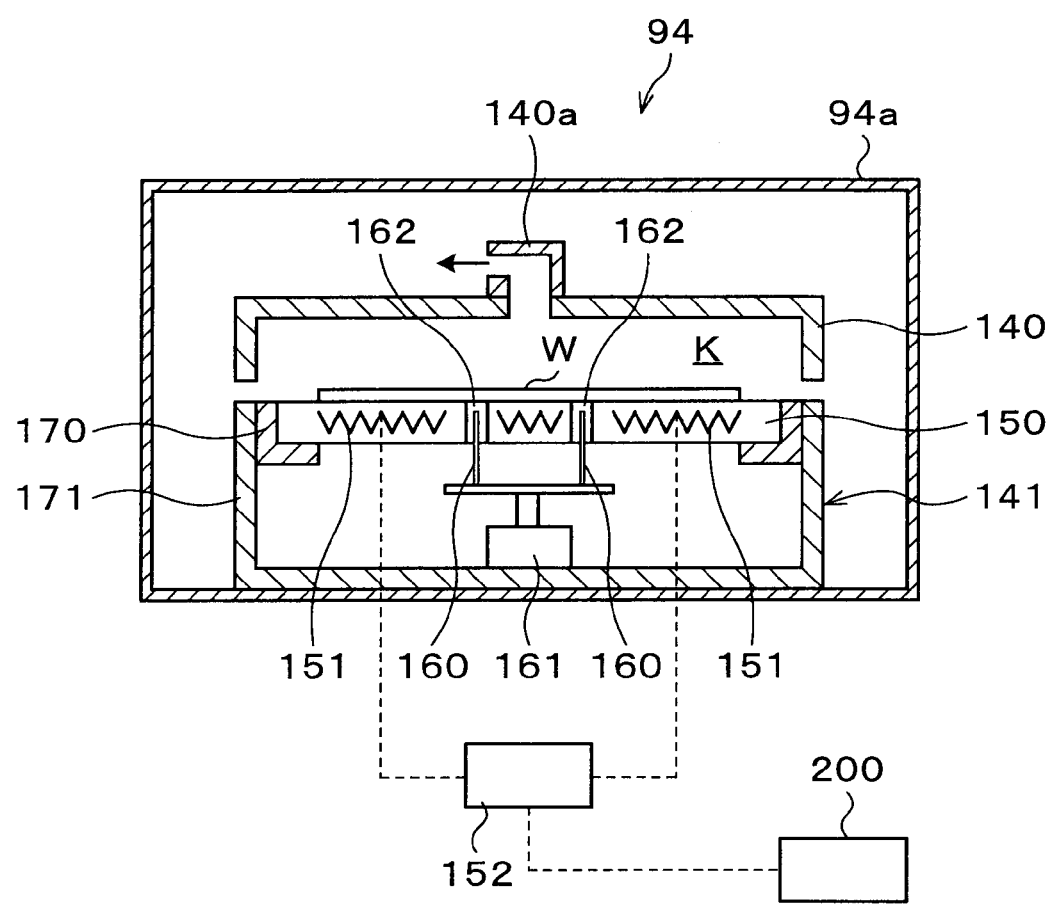
FIG. 8 is a longitudinal sectional view showing the outline of a configuration of a PEB unit.

Next, configurations of the above-described PEB units 94 to 99 will be described. The PEB unit 94 has a casing 94a having a transfer-in/out port (not shown) for the wafer W formed in its side surface as shown in FIG. 8. In the casing 94a, a lid body 140 that is located on the upper side and vertically movable, and a thermal plate accommodating part 141 that is located on the lower side and forms a processing chamber K together with the lid body 140.

The lid body 140 has an almost cylindrical shape having a lower surface open. At a central portion of an upper surface of the lid body 140, an exhaust portion 140a is provided. The atmosphere in the processing chamber K is uniformly exhausted through the exhaust portion 140a.

Figure 9:
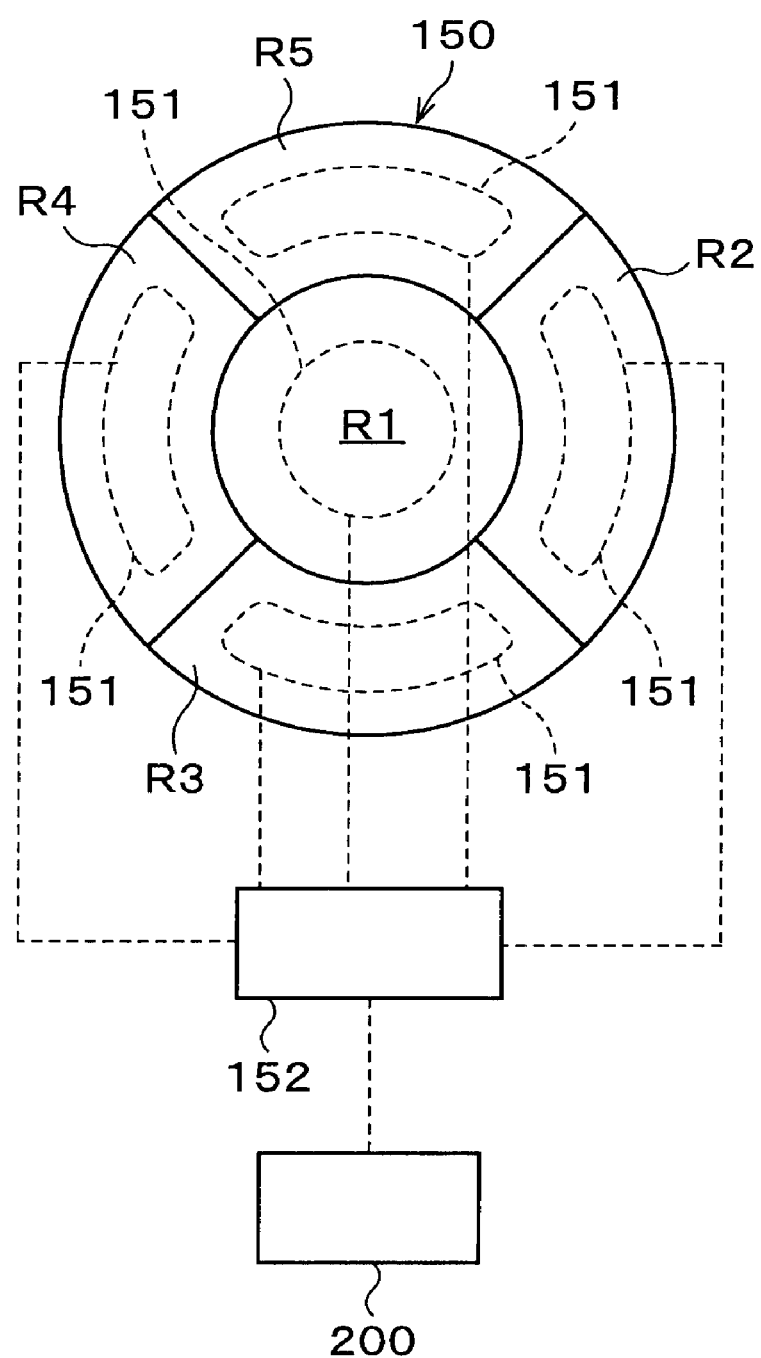
FIG. 9 is a plan view showing a configuration of a thermal plate in the PEB unit.

A thermal plate 150 is divided into a plurality of, for example, five thermal plate regions $R_1$, $R_2$, $R_3$, $R_4$ and $R_5$ as shown in FIG. 9. The thermal plate 150 is divided, for example, into a circular thermal plate region $R_1$ located at the central portion as seen in plan view and the thermal plate regions $R_2$ to $R_5$ which are made by equally dividing the peripheral portion around the thermal plate region $R_1$ into four sectors.

A heater 151 generating heat by power feeding is individually embedded in each of the thermal plate regions $R_1$ to $R_5$ of the thermal plate 150 and can heat each of the thermal plate regions $R_1$ to $R_5$. The heating value of each of the heaters 151 of the thermal plate regions $R_1$ to $R_5$ is adjusted by a temperature controller 152. The temperature controller 152 can adjust the heating value of the heater 151 to control the temperature of each of the thermal plate regions $R_1$ to $R_5$ to a predetermined heating temperature. The setting of the heating temperature in the temperature controller 152 is performed, for example, by the later-described control unit 200.

As shown in FIG. 8, raising and lowering pins 160 for supporting the wafer W from below and raising and lowering the wafer W are provided below the thermal plate 150. The raising and lowering pins 160 are vertically movable by means of a raising and lowering drive mechanism 161. Through holes 162 penetrating through the thermal plate 150 in the thickness direction are formed near the central portion of the thermal plate 150, so that the raising and lowering pins 160 can rise from below the thermal plate 150 and pass through the through holes 162 to project to above the thermal plate 150.

The thermal plate accommodating part 141 includes, for example, an annular holding member 170 for accommodating the thermal plate 150 and holding the outer peripheral portion of the thermal plate 150, and a support ring 171 in an almost cylindrical shape surrounding the outer periphery of the holding member 170.

Note that the configurations of the PEB units 95 to 99 are the same as that of the above-described PEB unit 94 and therefore the description thereof will be omitted.

Next, the control unit 200 controlling the heating temperature in the above-described PEB units 94 to 99 and the exposure amount in the aligner A will be described. The control unit 200 is composed of, for example, a general-purpose computer including a CPU and a memory, and connected to the measuring part 124 of the pattern dimension measuring unit 20 shown in FIG. 4, the temperature controller 152 shown in FIG. 8 and FIG. 9, and the light source 132 in the aligner A shown in FIG. 6.

Figure 10:
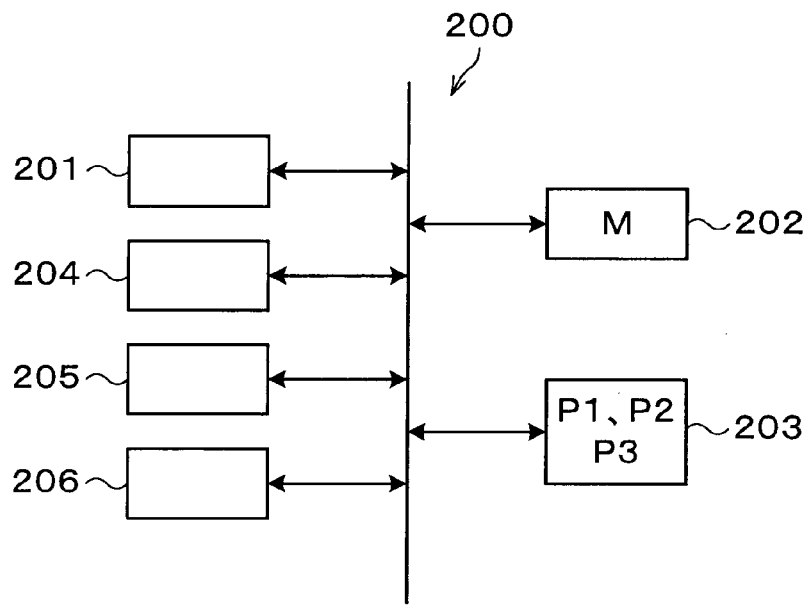
FIG. 10 is a block diagram showing a configuration of a control unit.

The control unit 200 has, for example, as shown in FIG. 10, an input part 201 into which a line width the measurement result from the pattern dimension measuring unit 20 is inputted; a data storing part 202 for storing various kinds of information required to calculate the correction value for the heating temperature in the PEB units 94 to 99 and the correction value for the exposure amount in the aligner A from the line width measurement result; a program storing part 203 for storing various programs for calculating the correction values for the heating temperature and for the exposure amount; a dimension classifying part 204 for classifying the distribution within the wafer W of the line width measurement result into a linear component expressed by an approximated curved surface and a nonlinear component other than that; a computing part 205 for executing the various programs to calculate the correction values for the heating temperature and for the exposure amount; and an output part 206 for outputting the calculated correction values for the heating temperature and for the exposure amount to the PEB units 94 to 99 and the aligner A, respectively.

Figure 11A:
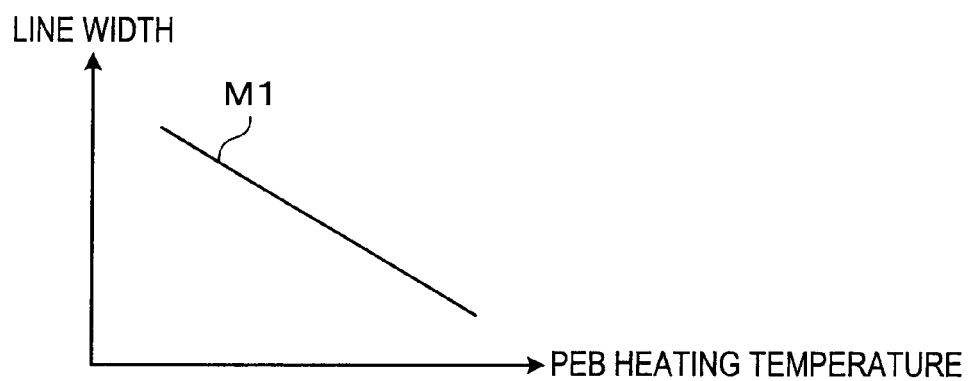
FIG. 11A is a graph indicating a correlation between the line width of the resist pattern and the heating temperature of the PEB processing.
Figure 11B:
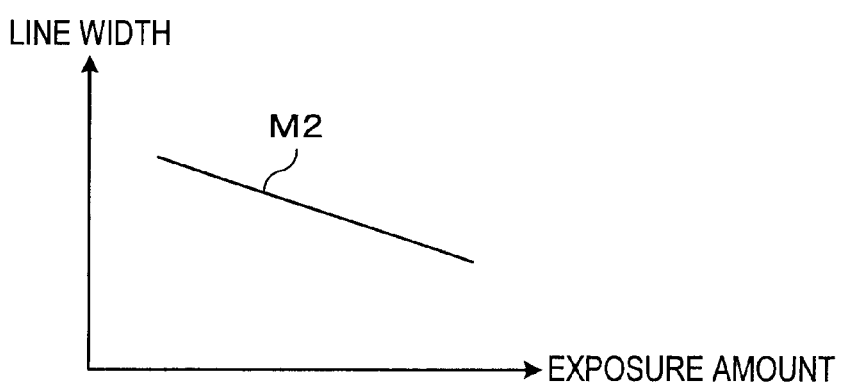
FIG. 11B is a graph indicating a correlation between the line width of the resist pattern and the exposure amount.

The data storing part 202 stores, for example, as shown in FIGS. 11A and 11B, a correlation M1 (FIG. 11A) between the line width of the resist pattern and the heating temperature in the PEB units 94 to 99; and a correlation M2 (FIG. 11B) between the line width of the resist pattern and the exposure amount in the aligner A. The correlations M1 and M2 are correlations previously obtained before the processing on the wafer W is performed. For example, the correlation M2 is calculated by forming resist patterns with the exposure amount varied for a plurality of wafers W and linearly interpolating the relation between the exposure amounts and the measured values of the line widths of the resist patterns. Note that in this embodiment, the slope of the correlation M2 (the dependence of the line width on the exposure amount) is set, for example, at $-3.03$ nm/(mJ/cm$^2$).

The program storage unit 203 stores a program P1 to calculate the correlation value for the heating temperature in each of the thermal plate regions $R_1$ to $R_5$ in the PEB unit 94 to 99, for example, from the correlation M1 based on the line width measurement result of the resist pattern within the wafer W from the pattern dimension measuring unit 20.

The program storage unit 203 further stores a program P2 to calculate the linear component and the nonlinear component, for example, from the line width measurement result of the resist pattern within the wafer W from the pattern dimension measuring unit 20, and a program P3 to calculate the correction value for the exposure amount in each of the exposure regions E in the aligner A from the correlation M2.

The program P2 calculates the linear component using, for example, the Zernike polynomial. The Zernike polynomial is a complex function having arguments (r, θ) of polar coordinates often used in the optical field. The Zernike coefficient Zn indicating each in-plane tendency component can be expressed by the following expression using the arguments (r, θ) of polar coordinates.

| | | |
|---|---|---|
| (1) | | Z1 |
| (r·cos θ) | | Z2 |
| (r·sin θ) | | Z3 |
| (2r²−1) | | Z4 |
| (r²·cos 2θ) | | Z5 |
| (r²·sin 2θ) | | Z6 |
| ((3r³−2r)·cos θ) | | Z7 |
| ((3r³−2r)·sin θ) | | Z8 |
| (6r⁴−6r²+1) | | Z9 |
| (r³·cos 3θ) | | Z10 |
| (r³·sin 3θ) | | Z11 |
| ((4r⁴−3r²)·cos 2θ) | | Z12 |
| ((4r⁴−3r²)·sin 2θ) | | Z13 |
| ((10r⁵−12r³+3r)·cos θ) | | Z14 |
| ((10r⁵−12r³+3r)·sin θ) | | Z15 |
| (20r⁶−30r⁴12r²−1) | | Z16 | and so on.

By linearly combining the Zernike polynomials, various curved surfaces can be created. In this embodiment, the line width measured values at a plurality of points within the wafer W are expressed in the height direction on the wafer W to grasp the line width tendency within the wafer W as a circular wavefront. By using the Zernike polynomials, the difference between the line width measured value and the target line width value can be calculated as a linear component.

The linear component calculated by the program P2 contains a factor to regularly vary the line width of the resist pattern for each wafer W such as, for example, a heater pattern (a pattern of the thermal plate regions $R_1$ to $R_5$), and therefore the linear component can be said to be a stable component with high reproducibility. Besides, the nonlinear component contains a factor to irregularly vary the line width of the resist pattern for each wafer W such as, for example, particles adhering onto the wafer W and the warpage of the wafer W, and therefore the nonlinear component can be said to be an unstable component with low reproducibility. Accordingly, when calculating the correction value for the exposure amount by the program P3, it is appropriate to calculate it using the linear component.

Note that the programs P1 to P3 to realize the function of the control unit 200 may be ones recorded on a computer-readable storage medium such as a computer-readable hard disk (HD), flexible disk (FD), compact disk (CD), magneto-optical disk (MO), or memory card, and installed from the storage medium into the control unit 200.

Figure 12:
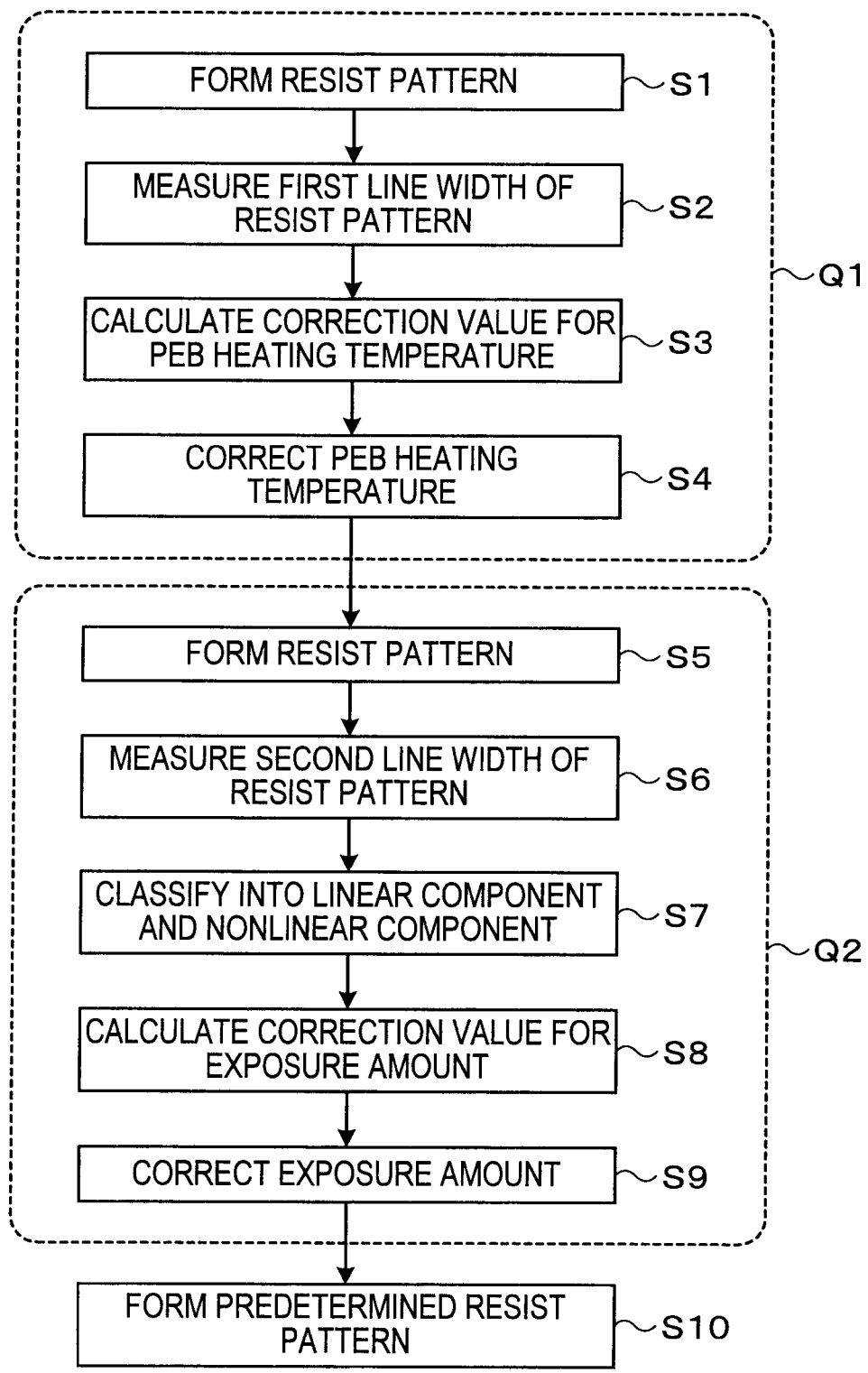
FIG. 12 is a flowchart explaining an inspection processing process of an inspection wafer and a processing process of a wafer.

Next, the processing process of the wafer W in the coating and developing treatment system 1 configured as described above will be described in conjunction with inspection processing of an inspection wafer W'. FIG. 12 is a flowchart explaining an inspection processing process of the inspection wafer W' and a processing process of the wafer W.

First, in order to correct the heating temperature in the PEB units 94 to 99, a series of photolithography processing is performed on an inspection wafer $W_1'$ by the coating and developing treatment system 1 to form a resist pattern on the inspection wafer $W_1'$ (Step S1 in FIG. 12). Details of the photolithography processing will be described in later-described processing of the wafer W. The inspection wafer $W_1'$ on which the resist pattern has been formed is transferred to the pattern dimension measuring unit 20 in the inspection station 3.

In the pattern dimension measuring unit 20, the inspection wafer $W_1'$ is mounted on the mounting table 120. Then, light is applied from the light applying part 122 to a predetermined portion of the inspection wafer $W_1'$, and its reflected light is detected by the light detecting part 123. A first line width of the resist pattern on the inspection wafer $W_1'$ is measured in the measuring part 124 (Step S2 in FIG. 12). The first line width measurement result of the resist pattern on the inspection wafer $W_1'$ is outputted to the input part 201 of the control unit 200.

In the control unit 200, the correction value for the heating temperature in the PEB units 94 to 99 is calculated in the computing part 205 based on the first line width measurement result of the resist pattern. Specifically, the correction value for the heating temperature in each of the thermal plate regions $R_1$ to $R_5$ is calculated from the correlation M1 (Step S3 in FIG. 12). Then, the calculated correction value for the heating temperature is outputted from the output part 206 to the PEB units 94 to 99, so that the heating temperature in each of the thermal plate regions $R_1$ to $R_5$ in the PEB units 94 to 99 is corrected by the temperature controller 152 (Step S4 in FIG. 12). Note that in this embodiment, the process of the above-described Steps S1 to S4 is referred to as a temperature correcting process Q1.

Next, in order to correct the exposure amount in the aligner A, a series of photolithography processing is performed on an inspection wafer $W_2'$ by the coating and developing treatment system 1 to form a resist pattern on the inspection wafer $W_2'$ (Step S5 in FIG. 12). In this photolithography processing, the heating processing (hereinafter, referred to as "PEB processing") is performed at the heating temperatures corrected at the above-described Step S4. The inspection wafer $W_2'$ on which the resist pattern has been formed is then transferred to the pattern dimension measuring unit 20 in the inspection station 3, and a second line width of the resist pattern on the inspection wafer $W_2'$ is measured by the same method as in the above-described Step S3 (Step S6 in FIG. 12). The second line width measurement result of the resist pattern on the inspection wafer $W_2'$ is outputted to the input part 201 of the control unit 200.

Figure 13:
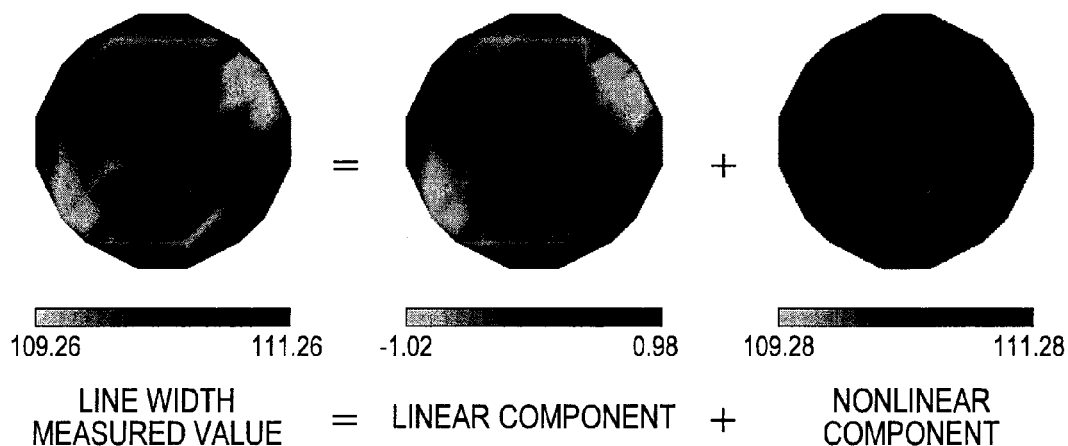
FIG. 13 is an explanatory view showing an appearance in which the line width of the resist pattern is classified into a linear component and a nonlinear component.
Figure 14:
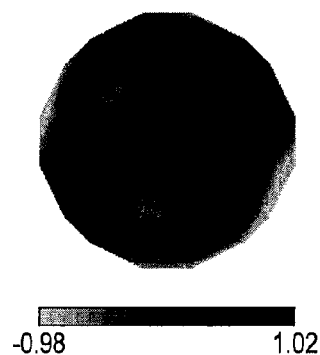
FIG. 14 is an explanatory view showing a distribution within a wafer of a target line width variation amount.
Figure 15:
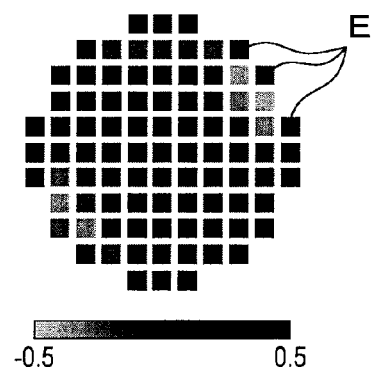
FIG. 15 is an explanatory view showing the correction value for the exposure amount.

In the control unit 200, the dimension classifying part 204 first classifies the distribution within the wafer W of the second line width measurement result of the resist pattern by calculating the linear component and the nonlinear component as shown in FIG. 13 using the program P2 (Step S7 in FIG. 12). The computing part 205 then finds the correction value for the exposure amount in the aligner A using the program P3 based on the calculated linear component. Specifically, a target line width variation amount is calculated from the linear component. The target line width variation amount is a value made by inverting the magnitude of the line width distribution of the linear component as shown in FIG. 14, that is a value made by multiplying the linear component by "−1". Then, the target line width variation amount is divided by the slope of the correlation M2 (the dependence of the line width on the exposure amount) to calculate the correction value for the exposure amount in each of the exposure regions E in the aligner A as shown in FIG. 15 (Step S8 in FIG. 12). In calculation of the correction value for the exposure amount, the correction value is calculated to decrease the exposure amount at a location where the line width of the linear component is small, whereas the correction value is calculated to increase the exposure amount at a location where the line width of the linear component is large. Thereafter, the calculated correction value for the exposure amount is outputted from the output part 206 to the aligner A, so that the exposure amount in the aligner A is corrected for each of the exposure regions E (Step S9 in FIG. 12). Note that in this embodiment, the process of the above-described Steps S5 to S9 is referred to as an exposure amount correcting process Q2.

Next, a series of photolithography processing is performed, for example, on product wafers W. First of all, the wafers W are taken out of the cassette C on the cassette mounting table 6 one by one by the wafer transfer body 8, and sequentially transferred to the transition unit 10 in the inspection station 3. The wafer W transferred to the transition unit 10 is transferred by the wafer transfer unit 12 to the processing station 4 and subjected to processing of forming a resist pattern. The wafer W is first transferred, for example, to the temperature regulating unit 70 included in the third processing unit group G3 in the processing station 4 and temperature-regulated to a predetermined temperature, and then transferred by the first transfer unit 30 to the bottom coating unit 43, in which an anti-reflection film is formed. The wafer W is then transferred by the first transfer unit 30 to the heat-processing unit 102, the high-temperature thermal processing unit 75, and the high-precision temperature regulating unit 80 in succession, in each of the processing units the wafer W is subjected to predetermined processing. The wafer W is then transferred by the first transfer unit 30 to the resist coating unit 40, in which a resist film is formed on the wafer W.

The wafer W on which the resist film has been formed is transferred by the first transfer unit 30, for example, to the PAB unit 81 and subjected to heat processing, and then transferred by the second transfer unit 31 to the edge exposure unit 104 and the high-precision temperature regulating unit 93 in sequence so that the wafer W is subjected to predetermined processing in each of the units. Thereafter, the wafer W is transferred by the wafer transfer body 111 in the interface station 5 to the aligner A.

The wafer W transferred into the aligner A is mounted on the mounting table 131. Then, light in the exposure amount corrected at the above-described Step S9 is applied from the light source 132 for each of the exposure regions E of the wafer W to expose the resist film on the wafer W to the predetermined pattern.

The wafer W for which the exposure processing has been finished is then transferred by the wafer transfer body 111 to the PEB unit 94 in the processing station 4.

The wafer W transferred to the PEB unit 94 is delivered to the raising and lowering pins 160 which have been raised and waiting in advance, and after the lid body 140 is closed, the raising and lowering pins 160 are lowered to mount the wafer W on the thermal plate 150. In this event, each of the thermal plate regions $R_1$ to $R_5$ of the thermal plate 150 has been heated to the heating temperature corrected at the above-described Step S4. The wafer W is then heated to the predetermined temperature by the heated thermal plate 150.

The wafer W for which the PEB processing in the PEB unit 94 has been finished is transferred by the second transfer unit 31 to the high-precision temperature regulating unit 91 and temperature-regulated there, and then transferred to the developing treatment unit 50 in which the developing treatment is performed on the wafer W to develop the resist film. The wafer W is then transferred by the second transfer unit 31 to the POST unit 85 and subjected to post-baking, and then transferred by the first transfer unit 30 to the high-precision temperature regulating unit 72 and temperature-regulated. The wafer W is then is transferred by the first transfer unit 30 to the transition unit 71 and transferred by the wafer transfer unit 12 to the transition unit 10 in the inspection station 3, and returned by the wafer transfer body 8 from the transition unit 10 to the cassette C. Thus, a series of wafer processing in the coating and developing treatment system 1 ends, whereby the predetermined resist pattern is formed on the wafer W (Step S10 in FIG. 12).

According to the above embodiment, since the heating temperature in the PEB units 94 to 99 is corrected for each of the thermal plate regions $R_1$ to $R_5$ in the temperature correcting process Q1, the PEB processing is then performed at the corrected heating temperatures to form a resist pattern on the wafer W, whereby an average value within the wafer W of the second line width of the resist pattern can be brought to a predetermined dimension. In the distribution within the wafer W of the second line width of the resist pattern, there may be a nonuniform region where the resist pattern is not formed in a predetermined line width due to, for example, the influence of the heater pattern (the pattern of the thermal plate regions $R_1$ to $R_5$). Hence, in this embodiment, the exposure amount in the aligner A is corrected for each of the exposure regions E in the exposure amount correcting process Q2, and exposure processing is then performed at the corrected exposure amounts. This makes it possible to form the resist pattern in the predetermined line width even in the above-described nonuniform region. Accordingly, the PEB processing is performed at the corrected heating temperatures in the PEB units 94 to 99 in the above manner and the exposure processing is performed at the corrected exposure amounts in the aligner A, whereby the resist pattern in the predetermined line width can be uniformly formed within the wafer W.

Further, in this embodiment, the distribution within the wafer W of the second line width of the resist pattern is classified into the linear component and the nonlinear component in the exposure amount correcting process Q2. The nonlinear component is not suitable as a correction object because it contains the factor to irregularly vary the line width of the resist pattern such as, for example, particles adhering onto the wafer W and the warpage of the wafer W as described above. In this embodiment, the exposure amount in the exposure processing is corrected based on the linear component obtained by subtracting the nonlinear component, so that the correction for the exposure amount can be appropriately performed.

About the effect that the above-described line width of the resist pattern becomes the predetermined line width and uniform within the wafer W, the results of simulation performed by the inventors using the method of this embodiment are shown in FIG. 16. Note that in this simulation, the target line width of the resist pattern is set to 110 nm. (a) shows the distribution within the wafer W, the line width average value and the 3 sigma (3σ) of the first line width of the resist pattern measured at Step S2. Note that the 3σ indicates variations within the wafer W of the line width. (b) shows the distribution within the wafer W, the line width average value and the 3σ of the second line width of the resist pattern measured at Step S6. (c) shows the distribution within the wafer W, the line width average value and the 3σ of the line width of the resist pattern formed at Step S10. Referring to (a) and (b), the line width average value before the correction of the heating temperature of the PEB processing was 113.63 nm, whereas the line width average value after the correction of the heating temperature of the PEB processing was 110.26 nm. Accordingly, it was found that the average value of the line width of the resist pattern can be brought to the predetermined target line width by correcting the heating temperature in the PEB processing. Further, referring to (b) and (c), the 3σ before the correction of the exposure amount was 1.90 nm, whereas the 3σ after the correction of the exposure amount was 0.85 nm. Accordingly, it was found that the resist pattern in the predetermined target line width can be uniformly formed within the wafer W by correcting the heating temperature of the PEB processing and correcting the exposure amount.

Figure 17:
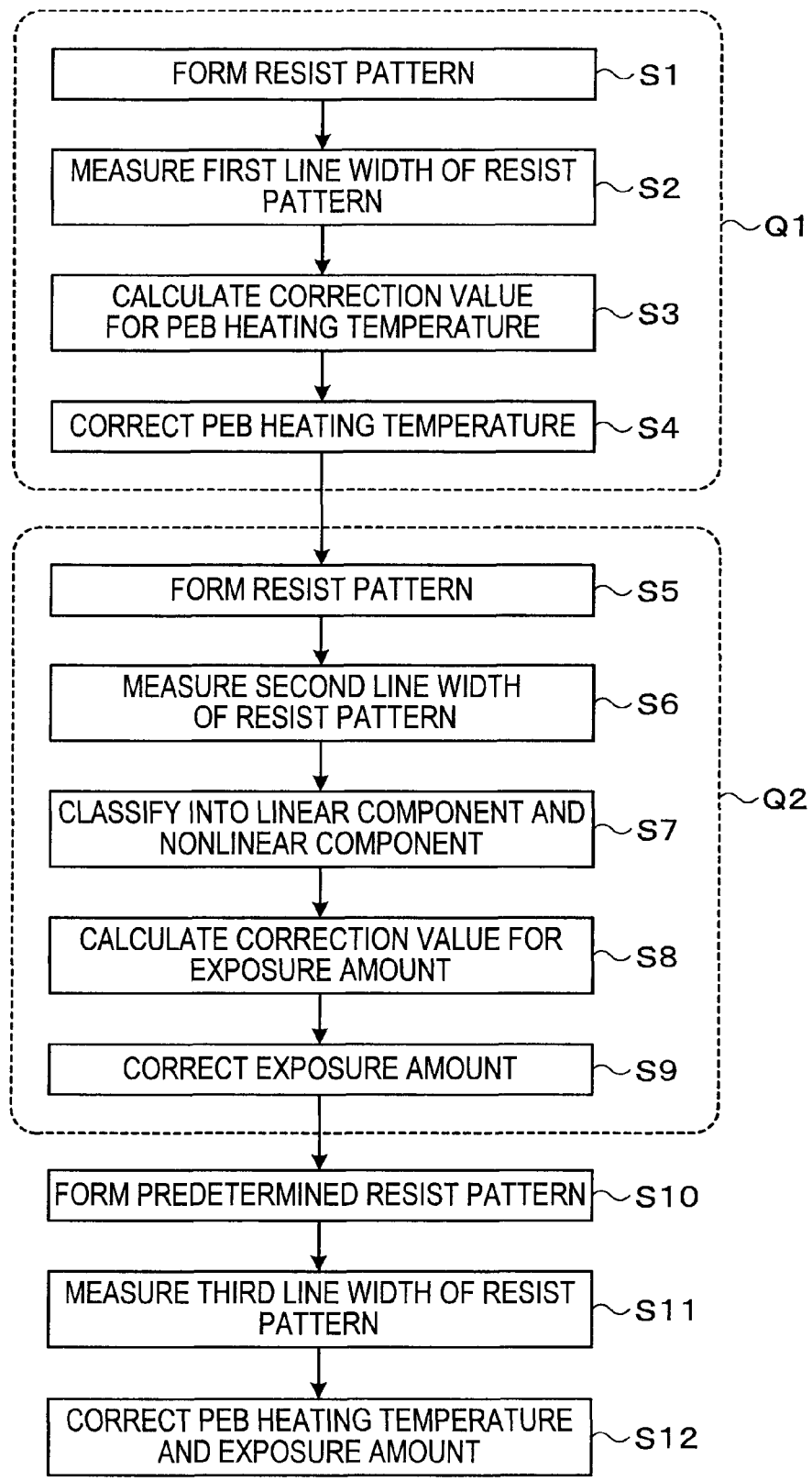
FIG. 17 is a flowchart explaining an inspection processing process of an inspection wafer and a processing process of a wafer according to another embodiment.

In the above embodiment, after the resist pattern is formed on the wafer W at Step S10, the wafer W is transferred again to the pattern dimension measuring unit 20, and a third line width of the resist pattern on the wafer W may be measured (Step S11 in FIG. 17). The third line width measurement result of the resist pattern is outputted to the control unit 200. In the control unit 200, the heating temperature in the PEB units 94 to 99 and the exposure amount in the aligner A are corrected by the same method as those in the temperature correcting process Q1 and the exposure amount correcting process Q2 (Step S12 in FIG. 17). In this case, even if the characteristics of the wafer W change with time, the heating temperature in the PEB units 94 to 99 and the exposure amount in the aligner A can be corrected at appropriate time so that a predetermined pattern can be uniformly formed on the wafer W thereafter.

Though the exposure amounts in the aligner A are corrected in the exposure amount correcting process Q2 after the heating temperatures in the PEB units 94 to 99 are corrected in the temperature correcting process Q1 in the above embodiment, the heating temperatures in the PEB units 94 to 99 may be corrected after the exposure amounts in the aligner A are corrected. Here, there may be a nonuniform region in the resist pattern on the wafer W, where the resist pattern is not formed in the predetermined line width only by correcting the exposure amounts in the aligner A without correcting the heating temperatures in the PEB units 94 to 99, due to, for example, a scan alternate difference and a measurement error in the aligner A. Since the exposure amounts are corrected and thereafter the heating temperatures in the PEB units 94 to 99 are further corrected in this embodiment, the resist pattern can be formed in the predetermined line width even in the above-described nonuniform region. This makes it possible to uniformly form the resist pattern in the predetermined line width within the wafer W.

Incidentally, the nonlinear component of the line width of the resist pattern is an unstable component with low reproducibility as described above, and strictly, this nonlinear component partly contains a component with high reproducibility, for example, a factor such as the heater pattern. Hence, the exposure amount is corrected based on the linear component in the exposure amount correcting process Q2 in the-above-described embodiment, but the exposure amount may be corrected based on a component with high reproducibility in the nonlinear component. In this case, after the heating temperatures in the PEB units 94 to 99 are corrected, for example, in the temperature correcting process Q1, resist patterns are formed on a plurality of wafers W and the line widths of the resist patterns are measured in the exposure amount correcting process Q2. In the control unit 200, the average values of the line widths of the resist patterns on the plurality of wafers W in each of the exposure regions E are calculated to calculate the correction value for the exposure amount in each of the exposure regions E from the correlation M2 between the line width of the resist pattern and the exposure amount. Thereafter, the PEB processing is performed at the corrected heating temperatures and the exposure processing is performed at the corrected exposure amounts, whereby a resist pattern in the predetermined line width can be uniformly formed within the wafer W.

Though the line width of the resist pattern is adjusted as the dimension of the resist pattern in the above embodiment, the sidewall angle of the resist pattern or the diameter of a contact hole may be adjusted instead. In this case, instead of the heating temperatures in the PEB units 94 to 99 corrected in the above-described embodiment, the heating temperatures in the POST units 85 to 89 or PAB units 81 to 84 may be corrected. Further, though the exposure amount in the aligner A is corrected as the processing condition in the exposure processing in the above embodiment, the focus value in the exposure processing in the aligner A may be corrected instead.

Preferred embodiments of the present invention have been described above with reference to the accompanying drawings, but the present invention is not limited to the embodiments. It should be understood that various changes and modifications are readily apparent to those skilled in the art within the scope of the spirit as set forth in claims, and those should also be covered by the technical scope of the present invention. The present invention is not limited to the embodiments but can take various aspects.

For example, though the pattern dimension measuring unit 20 is provided in the inspection station 3 in the above described embodiment, it may be provided in the processing station 4. Further, the pattern dimension measuring unit 20 may measure the dimension of the resist pattern within the wafer by applying electron beams the wafer W to capture an image of the front surface of the wafer W. Furthermore, the present invention is also applicable to the case where the substrate is a substrate other than the wafer, such as an FPD (Flat Panel Display), a mask reticle for a photomask or the like.

The present invention is useful in performing photolithography processing on a substrate such as, for example, a semiconductor wafer or the like to form a predetermined resist pattern on the substrate.

What is claimed is:

1. A substrate processing system for performing photolithography processing on a substrate to form a resist pattern on the substrate, said system comprising:
    a thermal processing unit for performing thermal processing on a substrate;

an aligner for performing exposure processing on the substrate;

a pattern dimension measuring unit for measuring a dimension of the resist pattern on the substrate; and a control unit configured to control said pattern dimension measuring unit to measure a first dimension of the resist pattern after the resist pattern is formed on the substrate, to control said thermal processing unit to perform temperature control of correcting a processing temperature of the thermal processing based on the measured first dimension from a previously obtained relation between a dimension of a resist pattern and a processing temperature of thermal processing during photolithography processing, and perform thermal processing at the corrected processing temperature, to control said pattern dimension measuring unit to measure a second dimension of the resist pattern after the resist pattern is formed on the substrate, and to control said thermal processing unit, said aligner, and said pattern dimension measuring unit to classify a distribution within the substrate of the measured second dimension into a linear component expressed by an approximated curved surface and a non-linear component other than the linear component, dividing the linear component into a plurality of regions, correcting a processing condition of exposure processing for each of the regions based on the linear component in each of the regions from a previously obtained relation between a dimension of a resist pattern and a processing condition of exposure processing during photolithography processing, and controlling said thermal processing unit, said aligner, and said pattern dimension measuring unit to perform thermal processing at the corrected processing temperature and exposure processing under the corrected processing condition to form a determined resist pattern on a substrate.

2. The substrate processing system as set forth in claim 1, wherein in said temperature correcting, said control unit divides a distribution within the substrate of the measured first dimension into a plurality of regions, and corrects the processing temperature of the thermal processing for each of the regions based on the first dimension in each of the regions.

3. The substrate processing system as set forth in claim 1, wherein in said dimension classifying, said control unit calculates the linear component using a Zernike polynomial.

4. The substrate processing system as set forth in claim 1, wherein in said thermal processing unit, the thermal processing is performed after the exposure processing and before a developing treatment.

5. The substrate processing system as set forth in claim 1, wherein in said pattern dimension measuring unit, a line width of the resist pattern is measured as a dimension of the resist pattern.

* * * * *